(12) United States Patent
Woods

(10) Patent No.: US 6,651,446 B1
(45) Date of Patent: Nov. 25, 2003

(54) BATTERY THERMAL DRAWER FOR VENTILATED CABINETS

(76) Inventor: Mark C. Woods, P.O. Box 33427, St. Paul, MN (US) 55133-3427

( * ) Notice: Subject to any disclaimer, the term of this patent is extended or adjusted under 35 U.S.C. 154(b) by 316 days.

(21) Appl. No.: 09/685,421

(22) Filed: Oct. 10, 2000

(51) Int. Cl.[7] .......................... F25B 21/02; F25D 23/12; H01L 35/02
(52) U.S. Cl. .......................... 62/3.7; 62/3.3; 62/259.2; 136/242
(58) Field of Search ................. 62/3.3, 3.2, 3.6, 62/3.7, 259.2, 332; 136/203, 204, 242; 361/676, 688, 697; 429/120

(56) References Cited

U.S. PATENT DOCUMENTS

| | | | |
|---|---|---|---|
| 4,280,330 A | 7/1981 | Harris et al. ..................... 62/3 |
| 4,301,658 A | 11/1981 | Reed ................................ 62/3 |
| 4,314,008 A | 2/1982 | Blake ............................ 429/8 |
| 4,838,911 A | 6/1989 | Robertson et al. ............ 62/3.3 |
| 4,999,576 A | * 3/1991 | Levinson ..................... 324/142 |
| 5,229,702 A | 7/1993 | Boehling et al. .............. 320/2 |
| 5,934,079 A | 8/1999 | Han et al. ..................... 62/3.2 |
| 6,294,721 B1 | * 9/2001 | Oravetz et al. ............. 136/242 |

* cited by examiner

*Primary Examiner*—Chen Wen Jiang
(74) *Attorney, Agent, or Firm*—James J. Trussell

(57) ABSTRACT

An electrical equipment cabinet is provided that includes an enclosure adapted to contain electrical equipment. A battery compartment, which is located in the enclosure, is adapted to contain at least one battery electrically coupled to the electrical equipment. The battery compartment has first and second opposing side walls, a bottom surface, and a first pair of vents located in the first and second side walls through which external air flows to remove heat. In addition, a second pair of vents, which are also located in the first and second side walls, allow gas emitted by the battery to escape by diffusion. A thermal stabilizing unit is disposed in the battery compartment for regulating the temperature of the battery in contact therewith. The thermal stabilizing unit has a conduit therein for conducting the external air flow between the vents in the first pair of vents.

25 Claims, 4 Drawing Sheets

BATTERY THERMAL DRAWER FOR VENTILATED CABINETS

FIELD OF THE INVENTION

The present invention relates to an outdoor electronics cabinet or the like having a back-up battery power source, and more specifically, to an outdoor electronics cabinet having a ventilated battery compartment that includes a thermal stabilizing unit for maintaining the temperature of the batteries within a specified range.

BACKGROUND OF THE INVENTION

Outdoor electrical equipment cabinets in the telecommunications industry have traditionally included rectifier units to convert commercially supplied AC power to DC power. Battery back-up systems are employed so that service is maintained in the event of AC power failure. The predominant battery architecture currently used in these cabinets is the sealed valve-regulated lead acid (VRLA) battery.

The temperature extremes experienced annually in certain climatic zones substantially reduce the life of VRLA batteries. For instance, in Florida, the hot temperatures reached in the summer can reduce battery life by a factor of 4 or more. Conversely, freezing temperatures can reduce battery performance. To operate for their maximum lifetime, battery manufacturers generally recommend that the battery temperature be maintained above freezing and below about 80° F. Accordingly, heating and cooling mechanisms are sometimes included with the battery to limit the thermal transients experienced by the VRLA batteries, thus prolonging battery life.

A VRLA battery emits hydrogen gas as it ages. An atmosphere with a hydrogen gas concentration above 4% is explosively flammable. Consequently, any chamber or cabinet used to house VRLA batteries must also be ventilated to prevent hydrogen gas build-up. However, this ventilation requirement complicates the task of maintaining the batteries within a desirable temperature range (i.e., through heating and/or refrigeration), since it inherently reduces the efficiency of any system employing active re-circulation of the air within the cabinet. This task is further complicated by the temperature fluctuations that typically accompany ventilation.

Accordingly, there is a need in the art for an outdoor electrical equipment cabinet which has a battery compartment that allows adequate ventilation for hydrogen gas to escape, while also maintaining the temperature of the battery within a prescribed range. There is also a need in the art for such a cabinet which is equipped with a mechanism for reducing temperature fluctuations. These and other needs are met by the present invention, as hereinafter described.

SUMMARY OF THE INVENTION

In accordance with the present invention, an electrical equipment cabinet is provided that includes an enclosure adapted to contain electrical equipment. A battery compartment, which is located in the enclosure, is adapted to contain at least one battery electrically coupled to the electrical equipment. The battery compartment has first and second opposing side walls, a bottom surface, and a first pair of vents located in the first and second side walls through which external air flows to remove heat. In addition, a second pair of vents, which are also located in the first and second side walls, allow gas emitted by the battery to escape by diffusion. A thermal stabilizing unit is disposed in the battery compartment for regulating the temperature of the battery in contact therewith. The thermal stabilizing unit has a conduit therein for conducting the external air flow between the vents in the first pair of vents.

In accordance with one aspect of the invention, the thermal stabilizing unit includes a thermally conductive element having first and second opposing surfaces. The first surface is adapted for supporting the battery. A heat sink is thermally coupled to the second surface of the thermally conductive element.

In accordance with another aspect of the invention, the conduit extends through the heat sink.

In accordance with another aspect of the invention, at least one thermoelectric module is provided for pumping heat from the battery to the heat sink. The thermoelectric unit is disposed between the thermally conductive element and the heat sink. The thermoelectric module may be a Peltier thermoelectric device.

In accordance with yet another aspect of the invention, the heat sink includes a substantially planar base and a plurality of parallel fins located on the base. In this case the conduit includes a plurality of channels defined by adjacent ones of the fins. Moreover, the conduit may further include at least one duct connecting the plurality of channels to a vent in the first pair of vents.

In accordance with another aspect of the invention, at least one resistive heating element is provided which is in contact with the thermally conductive element. The resistive heating element may be a rubber heating pad affixed to the thermally conductive element.

In accordance with another aspect of the invention, an insulating layer is disposed between the resistive heating element and the bottom surface of the battery compartment.

In accordance with still another aspect of the invention, a controller is provided for maintaining the temperature of the battery between upper and lower temperature setpoints. The controller may include an adjustment mechanism for selecting the upper and lower temperature setpoints. At least one temperature sensor may be electrically coupled to the controller for determining the temperature of the battery.

In accordance with another aspect of the invention, the battery compartment is configured as a slidable cabinet.

In accordance with yet another aspect of the invention, at least one support element is provided between the second surface of the thermally conductive element and the bottom surface of the battery compartment for supporting the weight of the battery. The support element may be a steel tube spacer, for example.

In accordance with another aspect of the invention, an air blower is provided in the conduit, which forces external air through the channels in the heat sink.

In accordance with still another aspect of the invention, an electrical equipment cabinet is provided which comprises a battery compartment segregated into at least first and second interior regions by means of a thermal stabilizing unit adapted to regulate the temperature of a battery in contact with the stabilizing unit. First and second vents are disposed in the first region, said first and second vents being in open communication with each other. Third and fourth vents are disposed in the second region, said third and fourth vents being in open communication with each other.

DETAILED DESCRIPTION OF THE INVENTION

Figure 1:
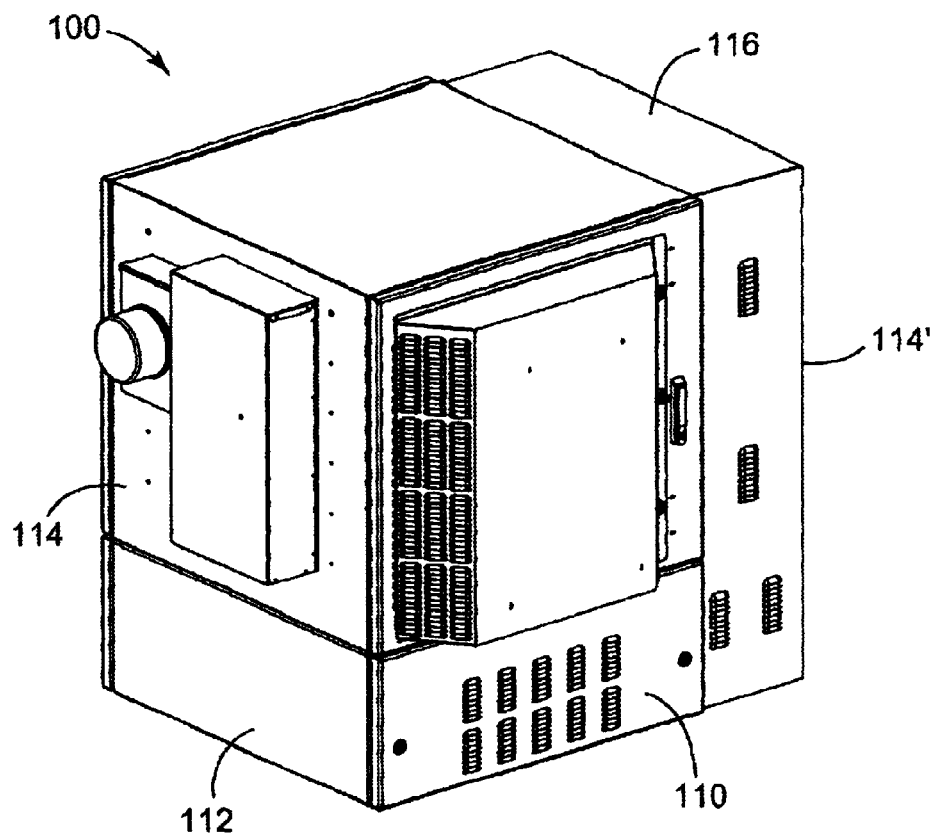
FIG. 1 illustrates an outdoor electrical equipment cabinet incorporating a ventilated battery compartment constructed in accordance with the present invention.

FIG. 1 illustrates an outdoor electrical equipment cabinet 100 incorporating a ventilated battery compartment 110 constructed in accordance with the present invention. The cabinet includes a base 112, side walls 114, 114', a roof 116, and the ventilated battery compartment. The cabinet contains a number of equipment racks or channel banks (not shown) which are located on shelves provided in the cabinet. The interior of the battery compartment contains a thermal stabilizing unit 216 for regulating the temperature of the batteries contained in the battery compartment. The cabinet may be configured as a slide-out drawer to facilitate assess to the batteries.

Figure 2:
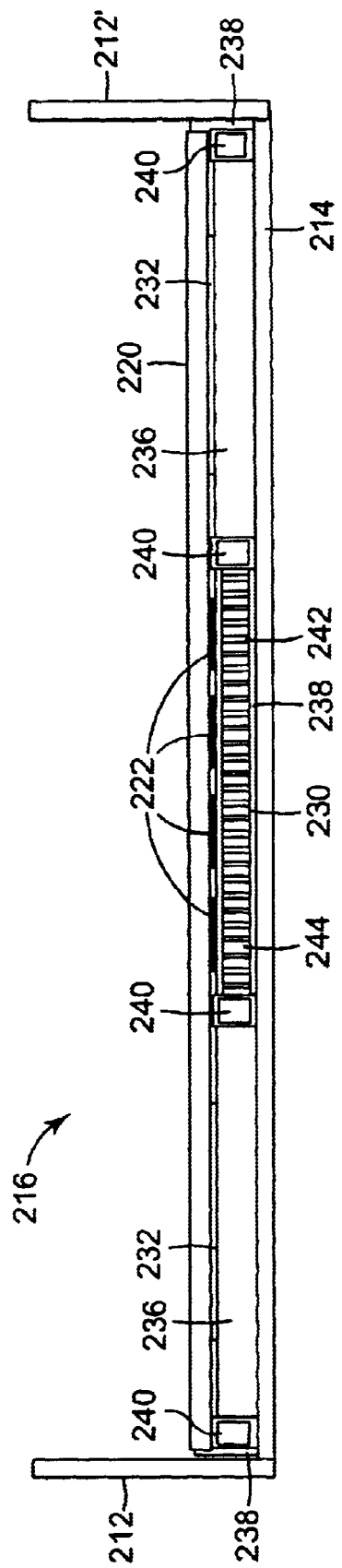
FIG. 2 illustrates a cross-sectional, fragmentary view of the battery compartment of FIG. 1 in which the thermal stabilizing unit is visible.

FIG. 2 shows a cross-sectional, fragmentary view of the battery compartment 110, which depicts left and right sidewalls 212, 212' and base 214. The thermal stabilizing unit 216 is a planar unit that has a footprint largely coextensive with the base of the compartment. The thermal stabilizing unit includes conductive plate 220, thermoelectric modules 222, heat sink 230, resistive heating elements 232, and insulating pads 236. The conductive plate of the stabilizing unit serves as the support surface on which the batteries (not shown) rest. The plate is formed from a thermally conductive material such as aluminum or copper to facilitate heat transfer. A series of thermoelectric modules 222 are located below the conductive plate and is in contact with its bottom surface. The thermoelectric modules are Peltier thermoelectric devices of conventional design.

Figure 3:
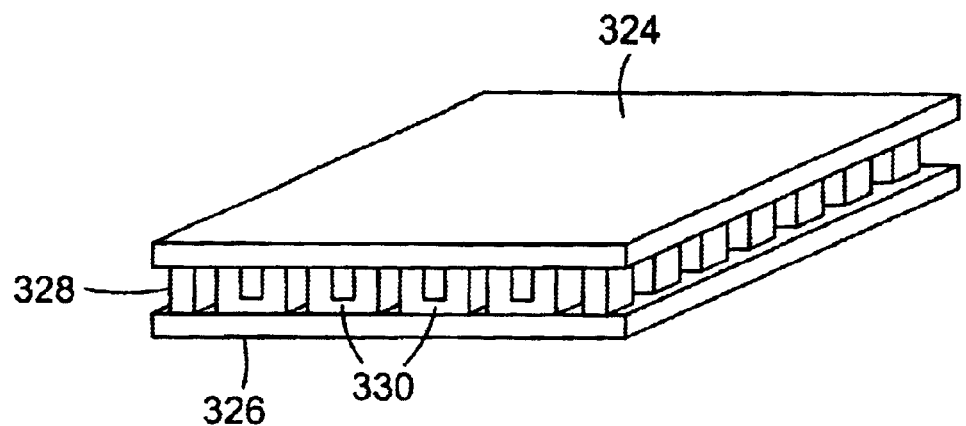
FIG. 3 illustrates a thermoelectric module employed for cooling.

As shown in more detail in FIG. 3, individual thermoelectric modules 222 are constructed from two parallel, electrically insulating plates 324 and 326 providing hot and cold thermal transfer faces. A series of alternating n-type and p-type semiconductor elements 328 are located between the insulating plates. Adjacent semiconductor elements are connected by conductive strips 330. Alternatively, adjacent semiconductor elements may be connected by bonding them with printed circuit bonds to the inner surface of the insulating plates. In operation, the upper plate 324 serves as the cold surface of the thermoelectric module and lower plate 326 serves as the hot surface. That is, heat is pumped from the upper plate to the lower plate. The temperature differential between the upper and lower plates is maintained by providing current to the semiconductor elements.

Returning to FIG. 2, a heat sink 230 is in contact with the lower plates of the thermoelectric modules. The heat sink is effectively shrouded by the conductive plate 220 (on the top), support elements 240 (on the sides), and the base 214 of the battery compartment 110 (on the bottom). The heat sink, which may be either an extrusion product or a bonded assembly, comprises a relatively thick base and a series of extended surfaces or "fins" 242. A series of channels 244 defined by adjacent fins extend through the heat sink. Heat pumped from the upper plates to the lower plates of the thermoelectric modules is transferred to the heat sink. The heat from the heat sink is transferred to external air flowing through the channels of the heat sink in a manner described below in connection with FIG. 4.

One or more thermally insulating pads 236 are located adjacent to the heat sink 230 and between the base 214 of the compartment 110 and the conductive plate 220. In the embodiment of the invention shown in FIG. 2, in which the heat sink is approximately centrally located on the base of the compartment, two thermally insulating pads are employed. Resistive heating elements 232 are sandwiched between the insulating pads and the conductive plate. In one embodiment of the invention, resistive heating elements are rubber heating pads affixed to the bottom surface of the conductive plate.

In operation, when current is supplied to the heating elements heat is generated and transferred to the conductive plate. Because of its high thermal conductivity, the plate conducts the heat so that the plate achieves a relatively uniform elevated temperature. In turn, the plate transfers the heat to the batteries so that their temperature is stabilized.

Figure 4:
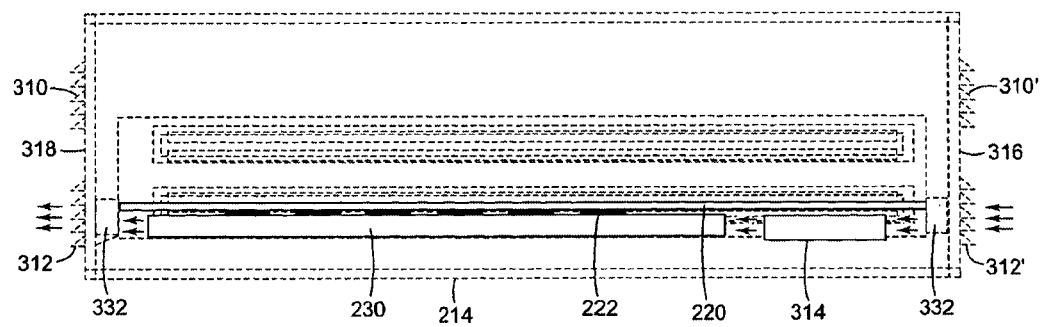
FIG. 4 illustrates a side view of the battery compartment shown in FIG. 2.

As best seen in FIGS. 1 and 4, the battery compartment 110 has louvers in its front 316 and rear walls 318. In particular, each wall has an upper set of louvers 310 and a lower set of louvers 312, 312'. A substantially rectangular duct 332 (indicated by dashed lines) allows ambient air to be communicated between the lower set of louvers on each of the front and rear walls and the channels 244 of the heat sink. The ducts prevent the ambient air from mixing with the air in the remainder of the battery compartment. When the thermal stabilizing unit 216 is situated in the bottom 214 of the battery compartment, the channels in the heat sink align with the duct and the lower set of louvers so that the channels are exposed to the external environment. Accordingly, a flow of external air is established through the bottom of the battery compartment.

At least one air blower 314 is located between one of the ducts and the channels.

Similar to the heat sink, the air blower is effectively shrouded by the conductive plate 220, support elements 240, and the base 214 of the battery compartment 110. As illustrated in FIG. 4, air is drawn into the rear lower louver array 312' and forced out the front lower louver array 312. In this way the heat from the heat sink 230 is transferred to the external environment by the flow of air being forced through the channels 244 of the heat sink.

The air blower is preferably a low-profile blower. For example, in some embodiments of the invention the blower may be a centrifugal blower with a thickness of 1.5 inches or less, which lies flat on the bottom of the battery compartment and has a circular intake in its top surface. In this way, the blower can be situated between the conductive plate and the bottom of the battery compartment. Alternatively, in some embodiments of the invention, an array of small axial fans could be used to force air through the heat sink.

As previously mentioned, the front and rear walls 316 and 318 also include an upper set of louvers 310, 310'. The upper louvers are situated above the thermal compensating unit so that they are directly exposed to the batteries resting on the conductive plate 220. In this way, hydrogen emitted by the VRLA batteries can escape the battery compartment 110 by diffusing through the upper louvers. The ambient air flowing through the ducts 332 and the channels 244 of the heat sink 230 does not mix with air in contact with the batteries. By isolating the ambient air flowing through the heat sink from the air in communication with the batteries, the air warmed by heat removed from the batteries is not re-circulated back to the batteries, which would reduce the efficiency of the thermal stabilizing unit 216.

Additional insulating pads may be provided at various locations around the thermal stabilizing unit to reduce the amount of heating and cooling that it requires. For example, in FIG. 2 insulating pads 238 may be provided between the interior surfaces of the battery compartment that contact the thermal stabilizing unit. A gas-permeable blanket may be placed over the batteries to provide additional thermal insulation while still allowing hydrogen gas to escape to an adequate degree.

To support the weight of the batteries (which in some cases may weight 800 pounds or more), the thermal stabilizing unit also may include one or more support elements 240. The support elements ensure that the weight of the batteries is not borne by the thermoelectric modules 222. In FIG. 2 the support elements are steel tube spacers on which conducting plate 220 rests. Of course, one of ordinary skill in the art will recognize that may other types and arrangements of support elements may be employed.

To control the temperature of the batteries, one or more temperature sensors is connected to the conductive plate and/or to the batteries themselves. The temperature sensor is connected to a temperature controller. The controller includes an adjustable means for setting the temperature setpoints. The temperature controller provides current to the thermoelectric modules and the resistive heating elements 232 in response to the temperature measured by the temperature sensor. The controller is set to upper and lower temperature setpoints, which correspond to the desired maximum and minimum battery temperature. When the temperature sensor determines that the battery temperature exceeds the upper setpoint, the controller supplies current to the thermoelectric modules 222 so that the batteries are cooled. Likewise, when the temperature sensor determines that the battery temperature falls below the lower setpoint, the controller supplies current to the resistive heating elements so that the batteries are heated. When current is supplied to the thermoelectric modules, current is also supplied by the controller to the blower 314. In this way heat pumped to the heat sink is transferred to the flow of air forced through the duct.

One advantage of the inventive thermal stabilizing unit is its compactness; in many cases the entire unit may occupy only the bottom 2 or 3 inches of the battery compartment. Accordingly, the overall footprint of the compartment need not be increased, as would be the case is if a bulky compressor-based system were employed rather than thermoelectric modules.

Although various embodiments are specifically illustrated and described herein, it will be appreciated that modifications and variations of the present invention are covered by the above teachings and are within the purview of the appended claims without departing from the spirit and intended scope of the invention. For example, while the invention has been depicted as a ventilated battery compartment that is incorporated within an electrical equipment cabinet, the invention is equally applicable to a stand-alone ventilated battery storage cabinet. Such a cabinet may advantageously include two or more of the inventive ventilated battery compartments depicted in the figures, each located on its own shelf. With such a vertically stacked arrangement, the cabinet can store many battery units within a reasonable overall footprint, which is particularly advantageous for higher wattage and/or extended duration back-up power applications.

What is claimed is:

1. An electrical equipment cabinet, comprising:
   an enclosure adapted to house electrical equipment;
   a battery compartment disposed in said enclosure, said compartment having first and second opposing side walls and a bottom surface, and being adapted to house at least one battery which is electrically coupled to the electrical equipment;
   a first pair of vents disposed in the first and second side walls through which external air flows to remove heat;
   a second pair of vents disposed in the first and second side walls which allow gas emitted by the at least one battery to escape by diffusion; and
   a thermal stabilizing unit disposed in the battery compartment for regulating the temperature of the at least one battery in contact therewith, said thermal stabilizing unit having a conduit therein for conducting the external air flow between the vents in the first pair of vents.

2. The cabinet of claim 1, wherein said thermal stabilizing unit comprises:
   a thermally conductive element having first and second opposing surfaces, said first surface being adapted for supporting the at least one battery; and a heat sink thermally coupled to second surface of the thermally conductive element.

3. The cabinet of claim 2, wherein said conduit extends through the heat sink.

4. The cabinet of claim 3, wherein said heat sink includes a substantially planar base and a plurality of parallel fins located on said base.

5. The cabinet of claim 4, wherein said conduit includes a plurality of channels defined by adjacent ones of the fins.

6. The cabinet of claim 5, wherein said conduit further includes at least one duct connecting the plurality of channels to a vent in the first pair of vents.

7. The cabinet of claim 5, further comprising an air blower located in said conduit forcing external air through the channels in the heat sink.

8. The cabinet of claim 2, further comprising at least one thermoelectric module for pumping heat from the at least one battery to the heat sink, said thermoelectric unit being disposed between the thermally conductive element and the heat sink.

9. The cabinet of claim 8, wherein said thermoelectric module is a Peltier thermoelectric device.

10. The cabinet of claim 8, further comprising at least one resistive heating element in contact with said thermally conductive element.

11. The cabinet of claim 10, wherein said resistive heating element is a rubber heating pad affixed to said thermally conductive element.

12. The cabinet of claim 10, further comprising at least one insulating layer disposed between the resistive heating element and the bottom surface of the battery compartment.

13. The cabinet of claim 2, further comprising at least one resistive heating element in contact with said thermally conductive element.

14. The cabinet of claim 13, wherein said resistive heating element is a rubber heating pad affixed to said thermally conductive element.

15. The cabinet of claim 2, further comprising a plurality of support elements each adjacent a side of said heat sink and disposed between the second surface of said thermally conductive element and the bottom surface of the battery compartment for supporting the weight of the at least one battery.

16. The cabinet of claim 1, wherein said thermal stabilizing unit includes:
   means for heating and cooling the at least one battery, said heating and cooling means including a controller for maintaining the temperature of the at least one battery between an upper and lower temperature setpoints.

17. The cabinet of claim 16, wherein said controller includes adjustment means for selecting the upper and lower temperature setpoints.

18. The cabinet of claim 16, wherein said heating and cooling means includes at least one temperature sensor electrically coupled to the controller for determining the temperature of the at least one battery.

19. The cabinet of claim 1, wherein said at least one battery is a valve-regulated lead acid battery and said gas is hydrogen.

20. The cabinet of claim 1, wherein said battery compartment is configured as a slidable cabinet.

21. The cabinet of claim 3, further comprising at least one support element disposed between the second surface of said thermally conductive element and the bottom surface of the battery compartment for supporting the weight of the at least one battery.

22. The cabinet of claim 21, wherein said support elements are steel tube spacers.

23. An electrical equipment cabinet, comprising:
   an enclosure adapted to contain electrical equipment;
   a battery compartment located in the enclosure adapted to contain at least one battery electrically coupled to the electrical equipment, said battery compartment having first and second opposing side walls and a bottom surface;
   at least one vent located in the first side wall which allows gas emitted by the at least one battery to escape by diffusion;
   means, disposed in said battery compartment, for regulating the temperature of the at least one battery, said regulating means including exhaust means for removing excess heat from within the battery compartment to the exterior of the enclosure, wherein said temperature regulating means includes:
     a thermally conductive element having first and second opposing surfaces, said first surface being adapted for supporting the at least one battery;
   a heat sink thermally coupled to said second surface of the thermally conductive element, wherein said temperature regulating means includes at least one thermoelectric module for pumping heat from the at least one battery to the heat sink, said thermoelectric module being disposed between the thermally conductive element and the heat sink, wherein said thermoelectric module is a Peltier thermoelectric device; and
   at least one resistive heating element heating said at least one battery said at least one resistive heating element in contact with said thermally conductive element.

24. The cabinet of claim 23, wherein said resistive heating element is a rubber heating pad affixed to said thermally conductive element.

25. The cabinet of claim 24, further comprising at least one insulating layer disposed between the resistive heating element and the bottom surface of the battery compartment.

* * * * *

UNITED STATES PATENT AND TRADEMARK OFFICE
CERTIFICATE OF CORRECTION

PATENT NO. : 6,651,446 B1  
DATED : November 25, 2003  
INVENTOR(S) : Woods, Mark C.

It is certified that error appears in the above-identified patent and that said Letters Patent is hereby corrected as shown below:

Title page,  
Item [73], Assignee, please insert: -- 3M Innovative Properties Company  
St. Paul, MN (US) --  
Item [56], References Cited, FOREIGN PATENT DOCUMENTS, please add the following references:  
-- EP 0 342 165 A2    11/1989  
WO 98/10629    3/1998 --

Signed and Sealed this

Sixth Day of July, 2004

JON W. DUDAS  
*Acting Director of the United States Patent and Trademark Office*